(12) United States Patent
Manhaeve et al.

(10) Patent No.: US 6,531,885 B1
(45) Date of Patent: Mar. 11, 2003

(54) METHOD AND APPARATUS FOR TESTING SUPPLY CONNECTIONS

(75) Inventors: Hans Manhaeve, Brugge (BE); Stefaan Kerckenaere, Bernegem (BE)

(73) Assignee: Interuniversitair Micro-Elektronica Centrum (IMEC vzw), Leuven (BE)

( * ) Notice: Subject to any disclaimer, the term of this patent is extended or adjusted under 35 U.S.C. 154(b) by 0 days.

(21) Appl. No.: 09/667,913

(22) Filed: Sep. 22, 2000

Related U.S. Application Data (63) Continuation-in-part of application No. 09/567,810, filed on May 9, 2000
(60) Provisional application No. 60/133,611, filed on May 11, 1999, and provisional application No. 60/155,607, filed on Sep. 22, 1999.

(51) Int. Cl.[7] .............................................. G01R 31/02
(52) U.S. Cl. ........................ 324/763; 324/537; 324/713
(58) Field of Search ................................ 324/763, 765, 324/76.39, 76.69, 76.77, 360, 363, 522, 537, 713, 771; 371/21.3, 21.5; 361/47, 140, 212; 307/66, 75

(56) References Cited

U.S. PATENT DOCUMENTS 5,057,774 A * 10/1991 Verhelst .................... 324/158.1
6,239,604 B1 * 5/2001 Lammeren ................... 324/765
6,268,665 B1 * 7/2002 Bobry .......................... 307/66

FOREIGN PATENT DOCUMENTS

| DE | 44 34 792 C1 | 9/1994 |
| EP | 0 386 804 | 4/1990 |
| EP | 0 525 421 A2 | 1/1992 |

OTHER PUBLICATIONS

MaiDon (Y. Maidon, Y. Deval, J.B. Begueret, J. Tomas and J.P. Dom "3.3V CMOS built–in cirrent sensor" Electronics Letters, 33(5):345–346, Feb. 1997).*

Segura (J. Segura, M. Roca, D. Mateo and A. Rubio "Built–in dynamic current sensor circuit for digital VLSI CMOS" Electronics Letters, 30(20):1668–1669, 29th Jul. 1994.*

* cited by examiner

*Primary Examiner*—Michael Sherry
*Assistant Examiner*—Trung Nguyen
(74) *Attorney, Agent, or Firm*—McDonnell Boehnen Hulbert & Berghoff (57) ABSTRACT

An apparatus and method for testing supply connections of an electronic device by using a current mirror configuration through using a particular connection of the branches of the current mirror to the supply line is provided. Such connection results in unbalanced operation of the current mirror but depending whether the supply connection under test is proper or not, the unbalance is essentially different, resulting in a high sensitivity of the test device.

20 Claims, 12 Drawing Sheets

Figure 4. Simulation Test Structure.

Figure 5. Monitor Detail.

METHOD AND APPARATUS FOR TESTING SUPPLY CONNECTIONS

REFERENCE TO RELATED APPLICATIONS

This application claims priority benefits and is a continuation-in-part to U.S. patent application Ser. No. 09/567,810, currently pending, filed on May 9, 2000. U.S. patent application Ser. No. 09/567,810 claims priority benefits to U.S. Provisional Patent Application Serial No. 60/133,611 filed on May 11, 1999 entitled "Method and Apparatus for Testing Electronic Devices." U.S. Provisional Patent Application Serial No. 60/133,611 is hereby incorporated by reference in its entirety. This application also claims priority benefits to U.S. Provisional Patent Application Serial No. 60/155,607 filed on Sep. 22, 1999, entitled "A Method and Apparatus for Testing Supply Connections." U.S. Provisional Patent Application Serial No. 60/155,607 is hereby incorporated by reference in its entirety. U.S. patent application Ser. No. 09/567,810 is hereby incorporated by reference in its entirety.

FIELD OF THE INVENTION

The invention relates to testing supply connections of electronic circuits.

BACKGROUND OF THE INVENTION

An on-board monitor, which is integrated with the functional circuit on the same silicon or substrate, is used for the verification of the power and ground soldering connections of a circuit with multiple power and ground pins when the package containing the circuit is mounted on a PCB board or an interconnection substrate. Such a monitor becomes more important as the number of device pins as well as the number of supply and ground pins increases and the pin dimensions of the package decreases.

A currently used inspection technique is for instance X-ray inspection.

Multiple power/ground pin connections cannot be tested easily once the package is mounted on the board. Electrical testing techniques fail because the power/ground pins are connected in parallel between the package and the board. Hence, a failing connection to one of these pins only marginally affects the overall contact properties, which when considering device tolerances makes it impossible to draw a clear conclusion. Despite the fact that due to a missing/failing connection the overall power/ground connection parameters are only slightly modified, such a problem will affect circuit operation, performance and reliability, when designers cannot afford as many power pins as required to have adequate margins. See M. Tegethoff, K. Parker, K. Lee, "Opens Board Test Coverage: When is 99% really 40%, Proceedings of the International Test Conference 1996 ITC96, pp. 333–339, Oct. 20–25, 1996, Washington D.C., USA.

Verifying the connectivity of a power/ground pin is easy when only one power/ground pin is used to feed a circuit, as a connectivity problem will result in a functional failure of the circuit. However, when the circuit is fed through multiple power/ground pins, verifying that each of these pins is connected properly is a difficult tasks as the pins are normally tied together electrically on the board and in the circuit and act as a set of parallel connection paths.

To solve this problem, a circuit is needed which is capable of verifying each power/ground pin connection independently, under the constraint that they are all tied up at board level and in most cases also at circuit level, and without affecting the supply/ground level of the circuit which is fed by these pins. Taking into consideration the desired very low resistance (order of magnitude: 10 mΩ) of each power/ground connection between bonding pad and power/ground ring, the circuit should be highly sensitive. Furthermore, to be of practical use, the operation of the test circuit should not be affected by process parameter variations and tolerances (excluding the need for calibration) and provide a high repeatability of the test results, even under difference test conditions.

The current state of the art verification techniques do not provide such characteristics. State of the art techniques are, for instance, the use of vision techniques and the use of current ($I_{DDQ/T}$) monitors. Vision techniques, such as the use of X-ray inspection, are expensive and time consuming and their application is limited in function of pin pitches and packages types. See J. Titus, B. Kerridge, "X-Ray Systems Reveal Hidden Defects", Test & Measurement Europe, August-September 1998, pp 8–19. Traditional current monitors are not sensitive enough, in most cases affecting the supply levels of the circuit under test and requiring calibration procedures to cope with process parameter variations and tolerances.

AIM OF THE INVENTION

It is an aim of the invention to present an apparatus and method for testing supply connections of electronic circuits with a high sensitivity.

SUMMARY OF THE INVENTION

In a first aspect of the invention, a test device (900) for testing a supply connection (80) of an electronic device (10) by measuring a test current flowing in said supply connection (80) is presented. Said test current flows from the power supply (70) in said supply connection (80). A current can also flow through the supply connection (400).

Said test device comprises at least a current mirror (20), being characterized by at least two branches (90)(100). At least one end of each of said branches (90)(100) is connected to a different location of the supply connection (80) to said electronic device (10) through connections (110)(120). Said current mirror (20) is adapted for generating an output voltage on line (140), being related to said test current. In a current mirror, in a typical operation, currents in said branches are generated which are proportional to each other with a fixed proportionality factor being determined by the parameters of the transistors in the branches of said current mirror. In the invention, the typical operation of a current mirror is not exploited. Indeed said current mirror generates an output voltage on line (140) being related to said test current and therefore generates currents in said branches whereby said proportionality factor is not necessarily respected. Still the terminology current mirror can be exploited as the circuitry still matches the current mirror layout.

In an embodiment of this aspect of the invention, said test device (120) further comprises means (150) for forcing said test current through said supply connection (80). Said means can be a switch (150) connected to ground. Ground and power supply can be reversed.

In an embodiment of this aspect of the invention, said test device (120) comprises means (160) for sampling said output voltage.

In an embodiment of this aspect of the invention, said test device (120) said test is integrated with said electronic device (10) on one integrated circuit (130).

In an embodiment of this aspect of the invention, said test device (120) is used for testing a CMOS electronic device.

In an embodiment of this aspect of the invention, said test device (120) is such that said test current flows also in said electronic device (10). Said switch (15) is then not necessary.

In a second aspect of the invention, a method for testing a supply connection (80) of an electronic device (10) by measuring a test current flowing from the power supply (70) in said supply connection is presented. A current can also flow through the supply connection (400).

Said method comprises at least of generating an output voltage on line (140) with at least a current mirror (20). Said current mirror is characterized by at least two branches (90)(100). At least one end of each of said branches is connected to a different location of the supply connection (80) to said electronic device via connections (110)(120). Said output voltage on line (140) is related to said test current. In a typical operation, the current mirror generates currents in the branches being proportional with a fixed proportionality constant. In one aspect of the invention, the typical operation is not exploited. Instead, the current mirror generates currents in said branches such that an output voltage is generated which is related to said test current. The proportionality between currents is therefore not respected.

In an embodiment of said second aspect of the invention, said test current is forced through said supply connection (80) for instance via switch (150) to the ground (65). Note that power supply and ground can be reversed.

In an embodiment of said second aspect of the invention, the following steps are found in the method. In a first step, a first output voltage being said output voltage on line (140) is determined or measured for zero test current by said means (160). In a second step, a second output voltage being is determined or measured by said means (160) while forcing said test current through said supply line (80). Said first step and second step can be reversed. In a third step, a third output voltage on line (170) is generated by said means (160). Said third output voltage is based on said first and second output voltage.

In an embodiment of said second aspect of the invention, a CMOS electronic device is tested.

In an embodiment of said second aspect of the invention, said test current also flows through said electronic device (10). Then no switch (150) is necessary.

BRIEF DESCRIPTION OF DRAWINGS

FIGS. 7a–7c shows the sensitivity of the test device for detecting faulty or non-proper connections and its robustness against mismatches.

DETAILED DESCRIPTION OF THE INVENTION

Figure 1:
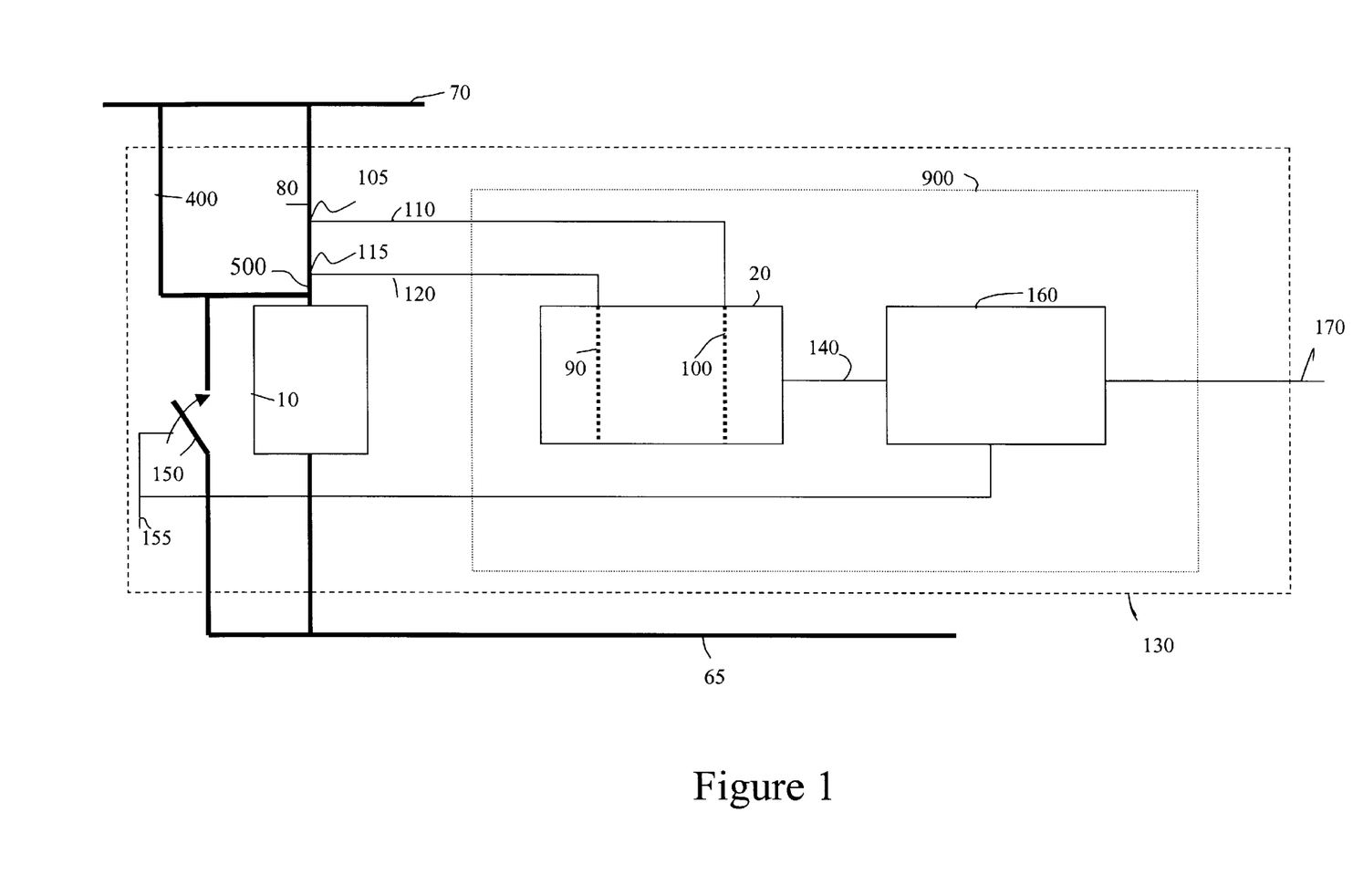
FIG. 1 is an example of a block diagram according to one embodiment of the invention.

The presently preferred embodiments of the invention will now be described by reference to the accompanying figures, wherein like elements are referred to by like numerals. Referring to FIG. 1, there is shown an example of a block diagram according to an one embodiment of the invention. The device under test (10) is connected to the power supply (70) by at least two power supply connections (400) and (80). The connection to the power supply (70) is under test. A switch (150) for forcing a test current is present and is connected to ground (65). The switch (150) is controlled by switch controller (155) which also sends information regarding the state of the switch (open or closed) to means for sampling the voltage (160).

As shown in FIG. 1, the test device (900) includes a current mirror (20). The current mirror (20) includes two branches (90)(100). One end of each of said branches (90)(100) is connected to different locations (105)(115) of the supply connection (80) to said electronic device (10) through connections (110)(120). Said current mirror (20) is adapted for generating an output voltage on line (140), being related to said test current. The output voltage on line (140) is fed to a means for sampling the voltage (160). In one embodiment, the sampling means can comprise a processor and a memory. The processor reads values (e.g., voltage values) stored in the memory and compares the values to produce an output. In one embodiment, the output is in the form of an output voltage (170). Alternatively, the sampling means is composed of memories or registers for storing the values for the voltages the value for the switch (ie., whether the switch is open or closed).

Figure 2:
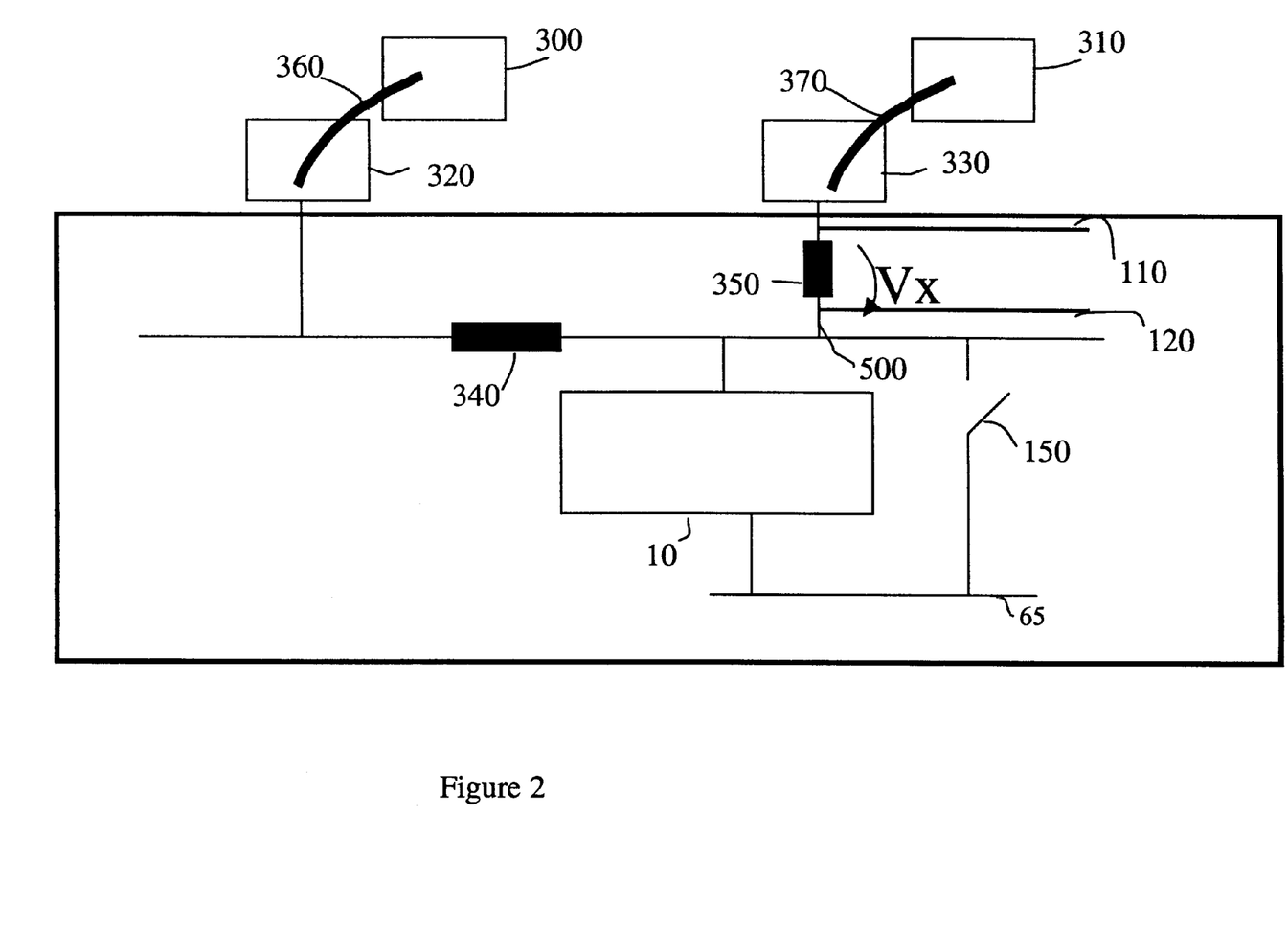
FIG. 2 is an example of one application of the test device as shown in FIG. 1.

Referring to FIG. 2, there is shown one application of one aspect of the invention. FIG. 2 shows the electronic device (10) being provided with a supply voltage and supply current via a plurality of off-chip connections. The device under test (10) is connected to at least two power connections. In the example shown in FIG. 2, the connections include off-chip connectors (300)(310). Resistance (350) shows that there is a voltage drop over the resistance (350).

Blocks (320) and (330) represent the connectors of the chip. Blocks (360) and (370) represent soldering from the off-chip to chip connectors. It is shown that the electronic device (10) is located nearby the connection path (310), (330). Therefore the resistance of the supply line from (310) towards (10) can be considered to be lower than the resistance of the supply line from (300) towards (10) if the assumption can be made that said connection is properly made. Block (340) therefore represents the additional resistance due to the larger distance from the electronic device (10) to (300). The device according to one aspect of the invention is made for testing such supply connections. Suppose that the connection via (310), (370) and (330) is under test. The latter connection is represented in FIG. 1 as (80). The longer distance connection is then represented as (400). It can be said that when the connection (80) is properly made, its resistance will be considerably smaller than the resistance of the supply connection (400). Block (350) represents the resistance of the part of the supply line (80) in between the two branches (110)(120) of the invented device, being connected to said supply line. Said resistance is expected in such a circuit or can be the parasitic resistance of that part. Typically, values for the resistance of the bonding and soldering (360)(370) is 200 milli Ohm. The resistance (350) has a typical value of 10 milli Ohm while the resistance (340) is typically 300 milli ohm. These numbers of typical resistance are merely for example and are not meant to limit the invention to such values. Vx is defined as the voltage drop over the resistance (350).

For the configuration depicted by FIG. 2 and abstracted in FIG. 1, four situations can be analyzed. The first situation is a non-testing mode with a proper connection via (310), (370) and (330) from the voltage supply to the electronic device. The switch (150) is open. Most of the supply current to the electronic device flows via (310), (370) and (330) due to its smaller resistance when compared with the other connections to the supply. Denote the current flowing in the supply line (500) $I_{DUT\_D}$, being the dominant current flow towards the Device Under Test (DUT) (10). The current flow through the resistance (350) is then $I_{DUT\_D}+I_1$ with $I_1$ being the current flow in branch (90) of the test device (900). Naturally, this results in a voltage drop $V_x$ over the resistance (350). Thus, in this non-testing mode for the situation of proper operation, the current mirror of the test device will be unbalanced, meaning that the ratio of the currents in the branches (90), (100) will deviate from the ratio expected from the transistor dimensions in a standard current mirror setup (i.e., where both branches of the current mirror are connected to the same voltage level).

The second situation is a non-testing mode with a non-proper, potentially broken connection via (310), (370) and (330) from the voltage supply to the electronic device. The resistance of that pathway is thus very large. The current flow via said pathway can be assumed to be small or even zero. The switch (150) is open. Most of the supply current to the electronic device flows via (300), (360) and (320) due to its smaller resistance when compared with the non-proper connection to the supply. The current flow through the resistance (350) is then $I_2$ with $I_2$ being the current flow in branch (100) of the test device (900). Naturally, this results in a voltage drop over the resistance (350). Note that said voltage drop is of reversed sign when compared with the voltage drop in the first situation. Thus, in this non-testing, non-proper operation situation, the current mirror of the test device will be unbalanced, meaning that the ratio of the currents in the branches (90), (100) will deviate from the ratio expected from the transistor dimensions, but this unbalance will be in the other direction, due to the sign reversal of the voltage drop $V_x$.

The third situation is a testing mode with a non-proper, potentially broken, connection via (310), (370) and (330) from the voltage supply to the electronic device. The resistance of that pathway is thus very large. The current flow via said pathway can be assumed to be small or even zero. The switch (150) is closed. Thus an extra and large test current will be drawn via said switch. Most of the supply current to the electronic device and said test current flows via (300), (360) and (320) due to its smaller resistance when compared with the non-proper connection to the supply. The current flow through the resistance (350) is then $I_2$ with $I_2$ being the current flow in branch (100) of the invented test device. As in the second situation, this results in a voltage drop $V_x$ over the resistance (350) and results in an unbalanced operation of the current mirror. When analyzing the current differences in the branches (90) or (100) in this third situation, one may make conclusions about the connection under test. If the current difference of situation three and two are the same, one can conclude that the connection is broken or not proper.

The fourth situation is a testing mode with a proper connection via (310), (370) and (330) from the voltage supply to the electronic device. The switch (150) is closed. Thus, an extra and large test current will be drawn via said switch. Most of the supply current to the electronic device and the test current $I_{TEST}$ flows via (310), (370) and (330) due to its smaller resistance when compared with the other connections to the supply. Denote the current flowing in the supply line (500) $I_{DUT\_D}+I_{TEST}$, with $I_{DUT\_D}$ being the dominant current flow towards the Device Under Test (DUT) (10). The current flow through the resistance (350) is then $I_{DUT\_D}+I_{TEST}+I_1$ being the current flow in branch (90) of the test device (900). Naturally, this results in a voltage drop $V_X$ over the resistance (350). This voltage drop will be larger than the voltage drop encountered in the other situations as the large test current flow mainly through the resistance (350). The current mirror of the test device (900) will be more unbalanced than in the first situation. Moreover, when compared to the other testing mode, described in the third situation, these voltage drops have another sign. Although both the third and fourth situations result in unbalanced current mirrors, the comparison of the currents will be totally different due to the sign reversal of the voltage drop and the value of the currents flowing. When analyzing the current differences in the branches (90) or (100) in this fourth situation, one may make conclusions about the connection under test. If the current difference of situation four is larger than that in situation one, one may conclude that the connection is proper.

Figure 3:
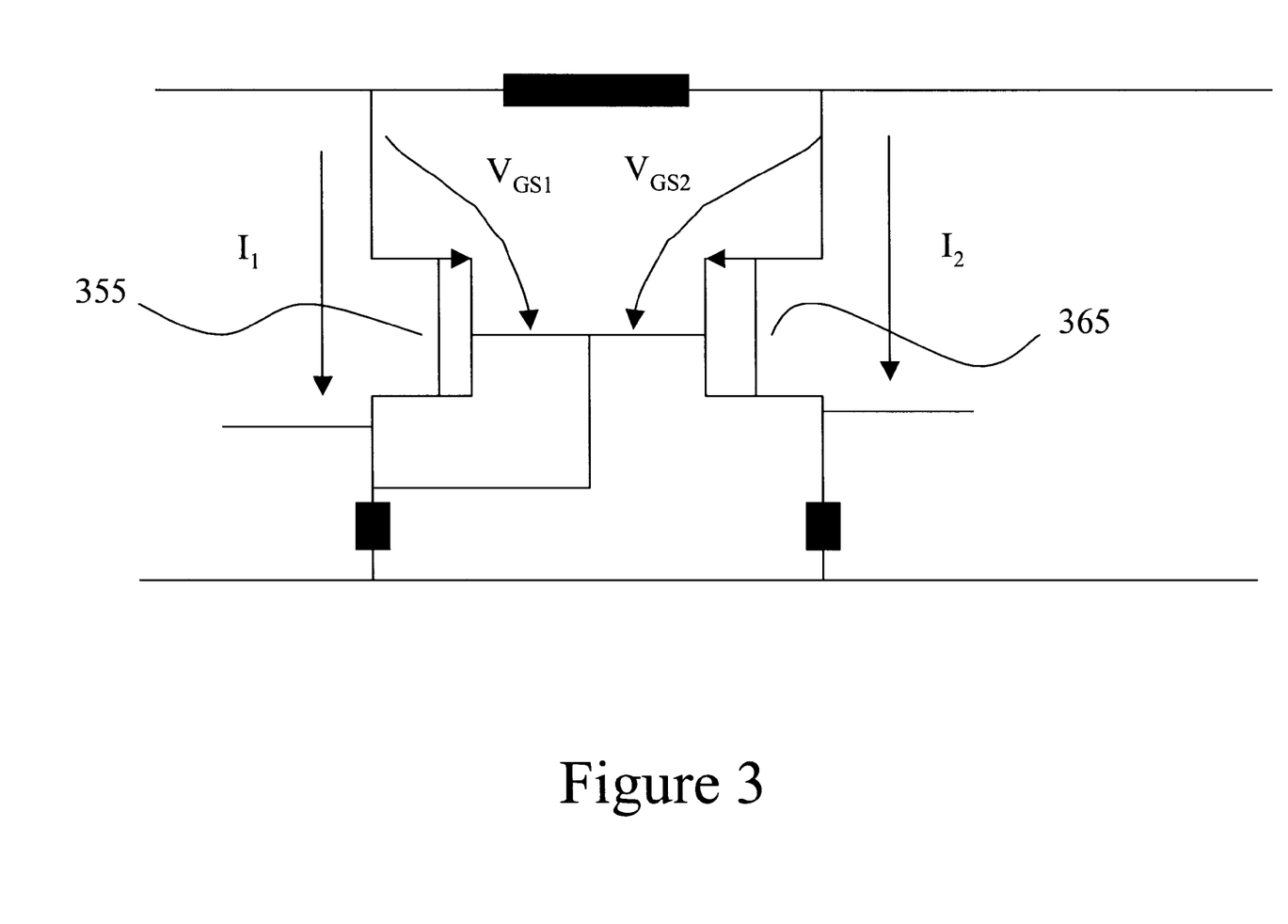
FIG. 3 shows one example of a typical current mirror configuration, which may be used in the invention.

Referring to FIG. 3, there is shown one example of the current mirror in test device (900). Alternative current mirrors are further within the scope of the invention. In an ideal current mirror operation, the MOS transistor 1 (355) and MOS transistor 2 (365) have the same gate to source voltage $V_{GS1}$ and $V_{GS2}$. Thus, following the MOS transistor current formulas [A] and [B], the currents will satisfy the relationship as shown in formula [C]. $W_1$, $L_1$ are the width and length of transistor 1. $W_1$, $L_1$ are the width and length of transistor 1. $W_2$, $L_2$ are the width and length of transistor 2. K is a technology dependent transistor parameter.

$$I_1 = K(W_1/L_1)(V_{GS1}-V_T) \qquad [A]$$

$$I_2 = K(W_2/L_2)(V_{GS2}-V_T) \qquad [B]$$

$$I_1(L_1/W_1) = I_2(L_2/W_2) \qquad [C]$$

In the operation of such a typical current mirror as described in the invention, the following relationship between the currents is established:

$$I_1(L_1/W_1) - I_2(L_2/W_2) = V_X$$

In the first situation (non-testing mode with a proper connection):

$$V_x = R_x(I_{DUT\_D}+I_1).$$

In the second (non-testing mode with a non-proper connection) and third (test mode—non-proper connection) situation:

$$V_x = -R_x I_2.$$

In the fourth situation (test mode—proper connection):

$$V_x R_x (I_{DUT\_D} + I_1 + I_{TEST})$$

When comparing the non-testing mode of situation one and the test mode of situation four, both having a proper connection, it can be said that the mirror circuit is driven further in unbalance when the connection is proper.

In the case with a faulty or non-proper connection, found in situation two and three, a small voltage drop is found, thus the mirror circuit can be considered to be nearly in balance condition when the connection is faulty.

Conclusions about the connections may be performed using a variety of methods. In one embodiment, conclusions about the connections of the circuits may be performed by examining the results of a single test and comparing the results with predetermined values stored in a look-up table in a memory device. In particular, predetermined values for situations one through four may be stored in a look-up table so that a single test (any of the four situations) may be performed to determine the state of the connection. The means for sampling the output voltage (160) may receive information regarding the state of the switch (150) (whether it is open or closed) via switch controller (155). The means for sampling the voltage (160) may also receive information regarding the output value (140) for the current mirror. The means (160) may then retrieve from the look-up table the predetermined values based on the four situations. For example, if the switch is open, situations one and two are implicated so that the values for both of the situations may be compared with the output value (140) in order to determine whether the output value is closer to the value for situation one (good connection) or to the value for situation two (bad connection).

Alternatively, and for better accuracy, conclusions may be drawn about the connections by comparing the output values (140) for when the switch (150) is open and closed. The monitoring of the currents (directly or indirectly) and comparing them with the dimensions of the transistors taken into account, results in a conclusion about the connection under test. The non-testing mode situations one and two can be used as reference situations. It is clear that the use of this typical current mirror as described results in a high sensitivity of detection of connectivity problem in the supply connections. Naturally, any electronic circuit with current mirror type of operation (or operation similar to a current mirror) can be used in the invention.

In an alternative approach, the dimensions of the transistors of the current mirror circuit used in the invention can be adapted in order to increase the sensitivity of the test device even more. Suppose that under normal current mirror operation, thus no voltage drop of the connections of the branches of said current mirror circuit, a first ratio between the currents of said branches is found while said current mirror circuit is in balance. In fact, balanced here means that said ratio of said currents is being determined by the transistor dimensions. One can enhance the sensitivity of said test device by changing the current mirror transistor dimensions such that in the second and third situation with a non-proper connection, said current mirror is in balance, meaning said currents in said branches are equal to said first ratio, although there is a voltage drop between its connections. As current mirrors are designed for satisfying said ratio condition on its currents even under severe conditions, the current mirror's transition into an unbalanced state will clearly indicate the cause, here pulling a current via said switch via a proper connection, resulting in a voltage drop. Said approach of changing transistor parameters results, in fact, in changing the reference situation. It can be said that said current mirror is being adapted in order to be in balance for a reference situation. Each of said situations described before (first, second, third and fourth) can be used as a reference situation for which said current mirror is adapted in order to be in balance.

Thus, one aspect of the invention describes a device for testing a supply connection of an electronic device by measuring a test current flowing in said supply connection. The device comprises at least a current mirror, the current mirror including at least two branches, at least one end of each of said branches being connected to an different location of the supply connection to said electronic device. Said current mirror is adapted for generating an output voltage, being related to said test current.

As discussed above, the output voltage can be generated by comparing the currents in the branches (90) and (100). When no test current flows through the resistance (350), being the case in situation three, another difference in currents will be observed than in the situation four, where the test current flows through the resistance (350).

One aspect of the invention thus describes a method for testing a supply connection of an electronic device by measuring a test current flowing in said supply connection. Indeed, when a test current is forced to flow, depending on whether the connection is proper or not, in test mode another difference in currents in the branches of the current mirror will be observed. Said difference in the currents can be used for generating an output, such as an output voltage (see e.g., (140) in FIG. 1), for instance via a comparator circuit. Said output voltage is thus related to said test current. In the method, one can determine a first output voltage being said output voltage for zero test current as in situation one and two. Also a second output voltage, being said output voltage while forcing said test current, can be determined as in situation three or four. These values for the output voltage may be stored in a memory device and thereafter compared using a processor or a comparator. As discussed previously, means for sampling said output voltage (160), in one embodiment, includes a memory device for storing the output values and a processor or a comparator for comparing the values. When comparing said first and second output voltage, one generates a third output voltage (element (170), as shown in FIG. 1), from which one can conclude about the connection under test.

The invention, although previously described to be used to verify the power and ground connections once the packaged device is mounted on a board or a system interconnect structure, can also be used during other phases of the test process, such as wafer sort testing, to verify if each of the power/ground probe pins is properly making contact. Hence, this increases the useable lifetime of the probe card, or at packed device test level, providing continuity checks for power and ground pins. It can also be used to provide continuity checks for pins other than power and ground pins, for which the traditional approach by measuring the ESD (Electrostatic Discharge) protection diodes fails, such as analog in- and outputs.

The test device can also be applied for measuring via the ring resistance (340), such that the two adjacent power-ground supply connections can be tested. As the test device is asymmetrical, meaning more sensitive to a current flowing in a first direction than a current flowing in a second direction, for such an approach one could use two such test devices, but with their connections being connected in an opposite way. The advantage of such an approach can be that more space for integrating said device under said ring resistance is available.

The test device can be adapted such that in non-testing mode, it can go in power-down mode. Note that the test device can be exploited also for current measuring, and can, for instance, be used for detecting whether the current drawn by device (10) exceeds a certain threshold.

Figure 4:
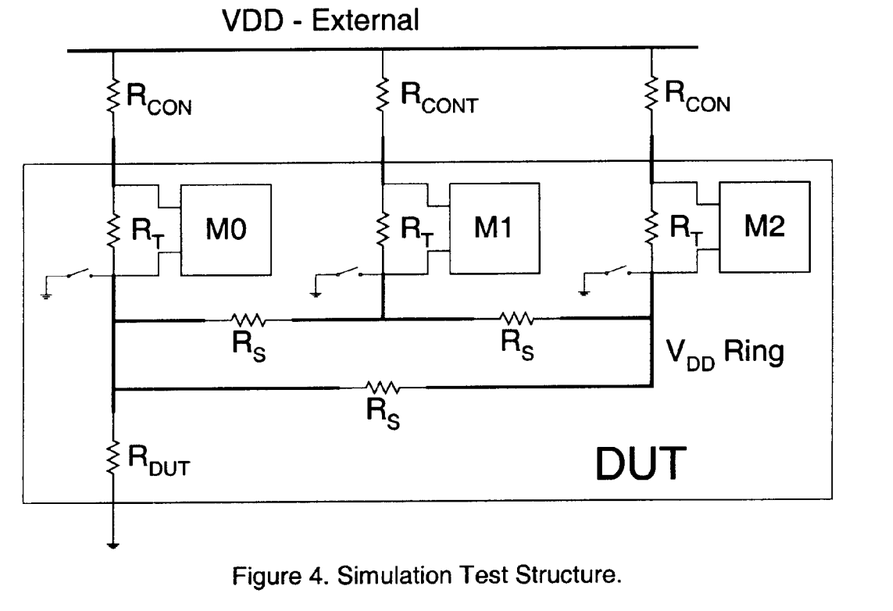
FIG. 4 shows a simulation test structure, according to one aspect of the invention, wherein three test devices are connected in between an outer supply voltage ring and an inner supply voltage ring.

To validate and evaluate the test device operation and the related test method, a particular test device or monitor design was carried out, although the invention is not limited hereto. Transistor dimensions were calculated based on Alcatel Microelectronics' 0.7 μm CMOS process. Numerous simulations, including Monte-Carlo ones, were carried out to evaluate the behavior of the monitor within the process boundaries (using Slow, Typical and Fast process parameters) as well as under the influence of mismatch ($V_T$, β). To carry out the simulations, the test structure as shown in FIG. 4 was used. The test structure represents a situation where three supply connections are used to feed the circuit (DUT). The connection between the external $V_{DD}$ and the internal $V_{DD}$ ring is represented by 2 resistors, $R_{Con}$ being the resistance of soldering and bonding wire and $R_T$ being the resistance of the on-chip wiring between power pad and the internal supply ring. Each segment of the internal $V_{DD}$ ring is modeled as a resistor $R_s$. Across each resistor $R_T$ a monitor M0, M1, M2 is connected, as further illustrated in FIG. 5. To model a defect (e.g., a bad soldering connection or a bad bonding connection or a combination of both), the value of one of the $R_{CON}$ resistors, namely $R_{CONT}$ (as shown in FIG. 4) was changed over the simulations. The nominal values used for the different modeling resistors are Z: $R_{CON}$: 200 mΩ, $R_T$: 10 mΩ and $S_s$: 300 mΩ. The value of $R_{DUT}$ was set to 100 MegΩ. For a faulty connection $R_{CONT}$ was set to 200 MegΩ. The $V_{DD}$ voltage was set to 3.3V. To illustrate the operation of the monitor and its effectiveness, some of the simulation results are added hereafter.

Figure 5:
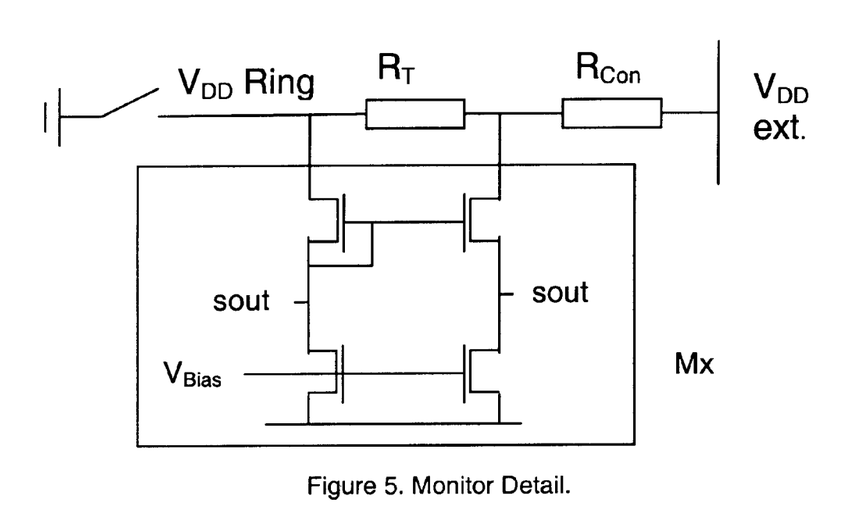
FIG. 5 shows a schematic example of a test device according to one aspect of the invention. The test device comprises a current mirror, with branches which are connected to a different location of a supply line towards the device under test, here referred to as the inner voltage ring.
Figure 6A:
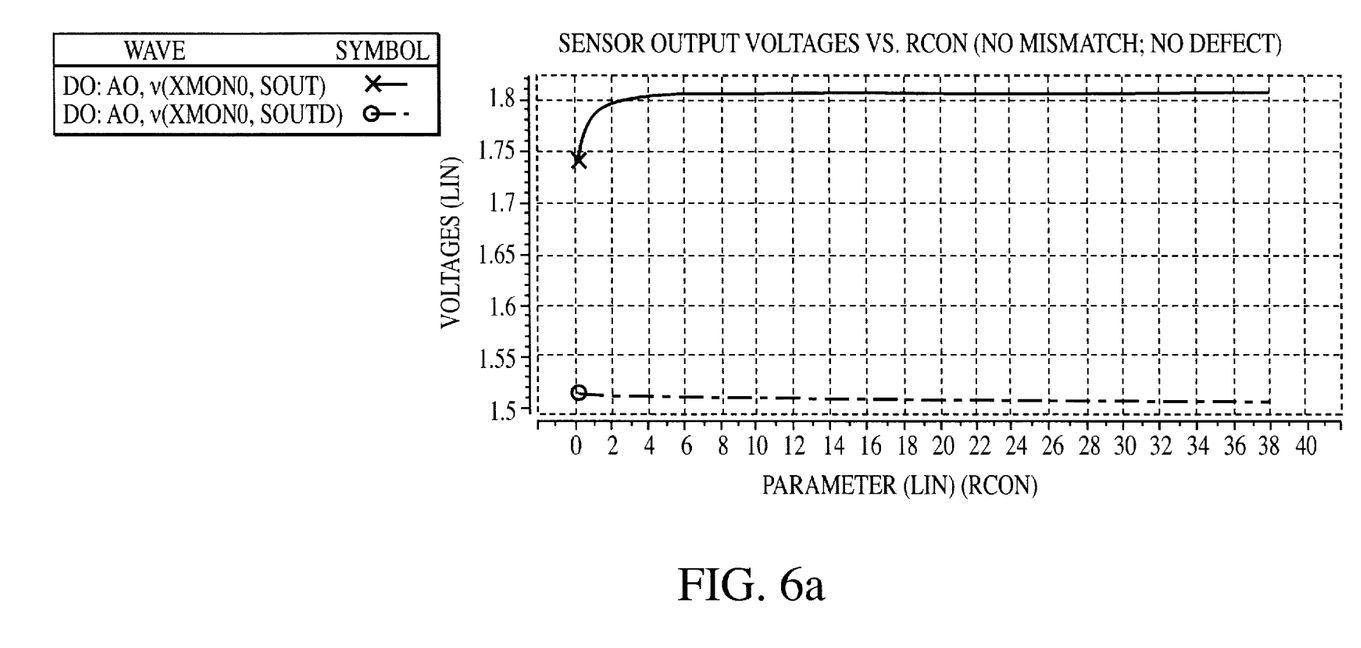
FIGS. 6a and 6b show graphs of the voltage outputs of the branches of said test device of FIG. 5, illustrating substantially different behavior, represented here by comparison of said voltage outputs of said test monitor, depending on whether a faulty or non-proper connection is present.
Figure 6B:
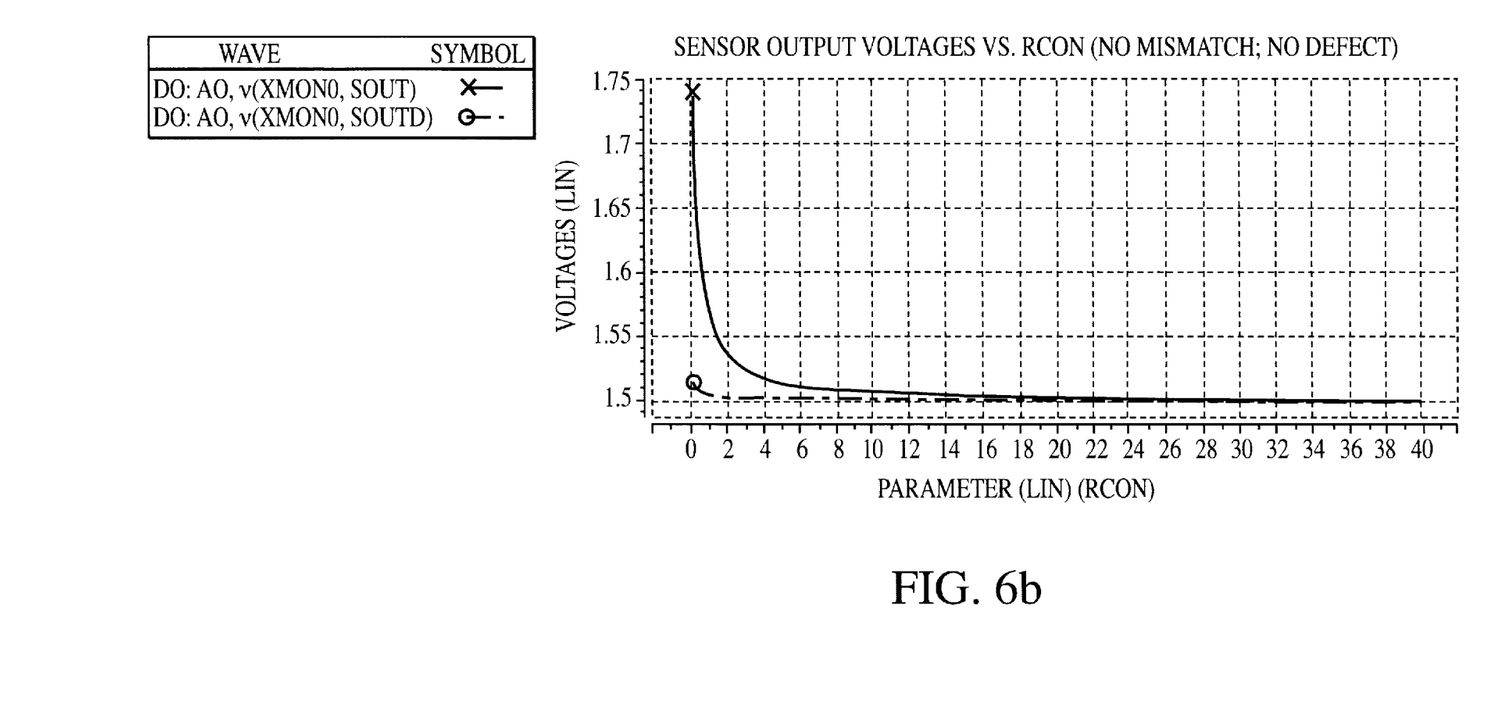

FIGS. 6a and 6b show the behavior of the internal monitor nodes Sout and Soutd (as shown in FIG. 5) as a function of the value of the connection-modeling resistor $R_{CONT}$. FIG. 6a shows the nodes on monitor M0, adjacent to the connection under test, and FIG. 6b shows the internal nodes of monitor M1, monitoring the faulty connection. FIGS. 6a and 6b clearly show the principle of using a unbalanced mirror, where the mirror is driven further in unbalance when the connection is proper (FIG. 6a) and where the mirror is coming to a balance condition when the connection is faulty (FIG. 6b) and hence the potential to make a decision on the quality of the connection, based upon the voltages at least one of the nodes of said mirror. Alternatively comparing both voltages with voltage comparators can be used or also comparing the current in the branches of said mirror can be exploited.

Figure 7A:
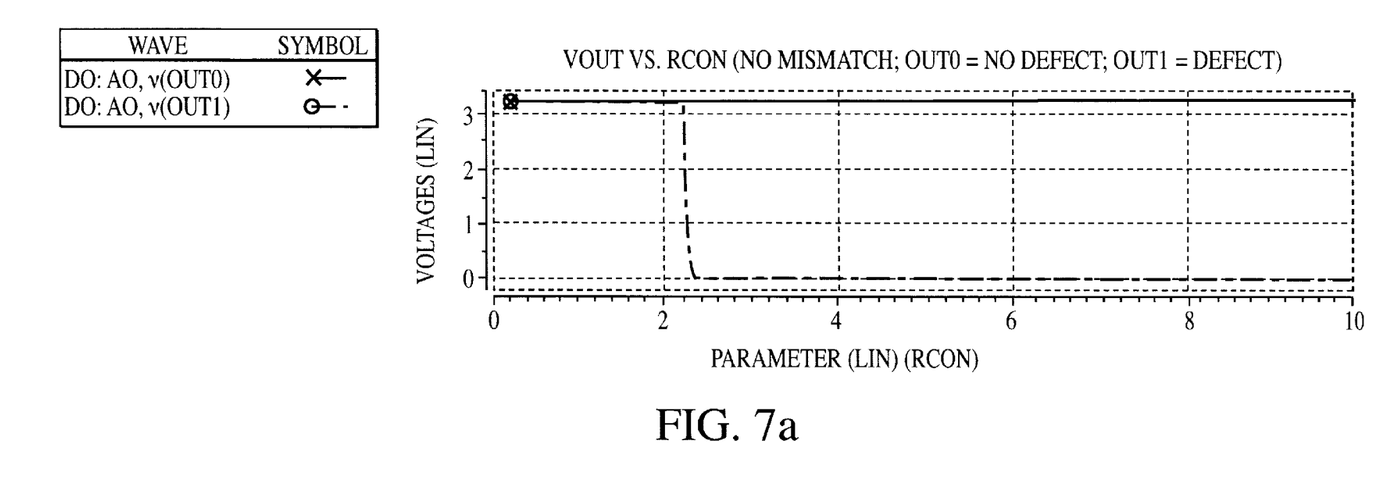
FIGS. 7a–7c show graphs of the output of said test device of FIG. 5, said output being generated by comparing said voltage outputs of said branches through a comparator.
Figure 7B:
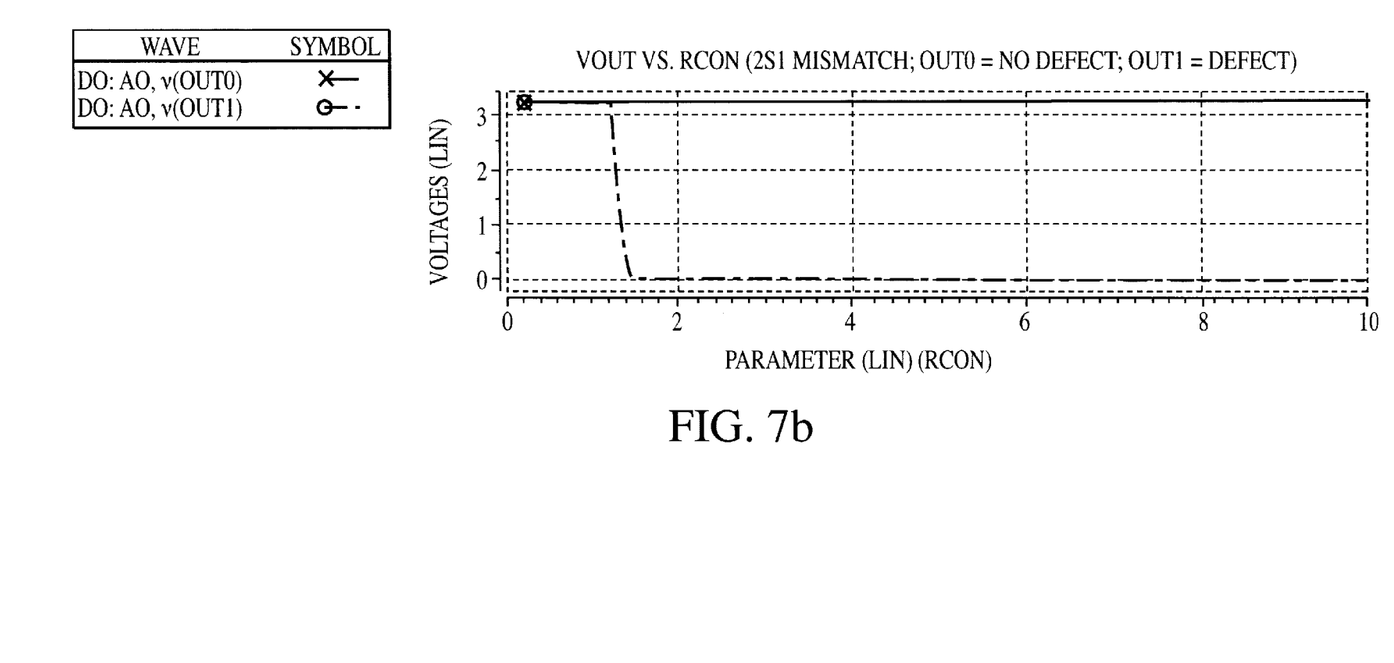
Figure 7C:
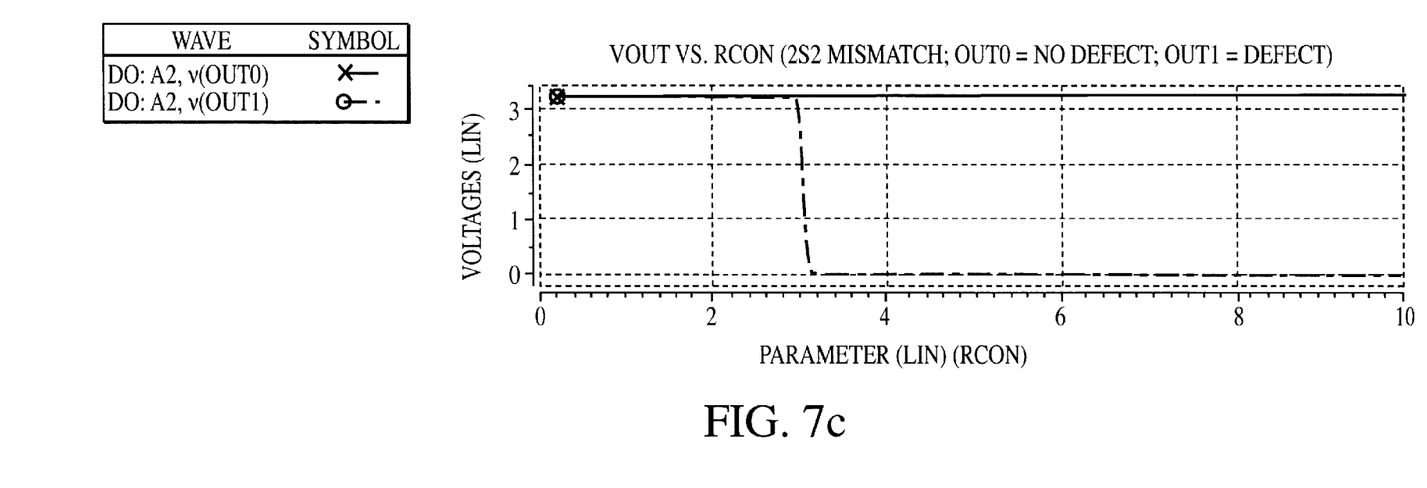

FIGS. 7a–7c show the output of the monitor structure, as a function of the value of the connection modeling resistor $R_{CONT}$, and taking into account different mismatch situations. Each of the graphs in FIG. 7 shows the output of a monitor M0 connected to a proper connection (full line) and the output of the monitor M1 connected to the 'faulty' connection (dashed line). FIG. 7a shows the reaction of these monitors for typical process parameters and when no mismatch is taken into account. FIG. 7b shows the influence of $V_T$ mismatch and FIG. 7c shows the influence of β mismatch. In all cases, detection of the 'faulty' connection (being a connection resistance>1.5Ω, being 7.5 times the normal connection resistance and determined by the comparators' switching level) is guaranteed.

Figure 8A:
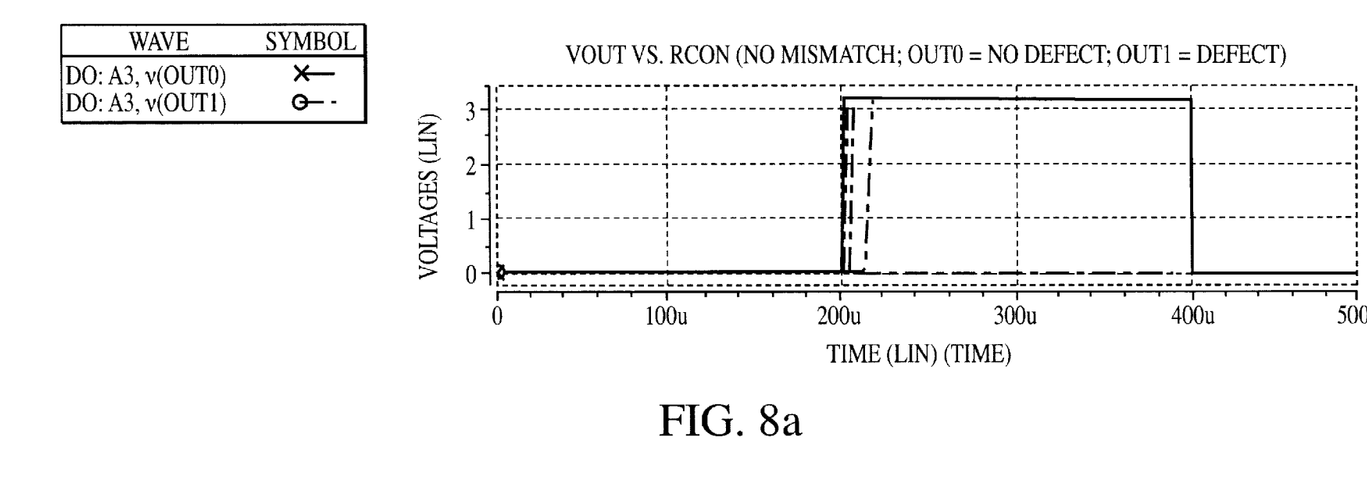
FIGS. 8a–8c shows graphs of the time dynamics of the testing method, by distinguishing non-testing and testing phases. In the non-testing phase, no test current is available. In the testing phase, a test current is pulled through switches and depending on whether a non-proper or faulty connection is found, different dynamics of said test device, are observed. Robustness against mismatches is also illustrated.
Figure 8B:
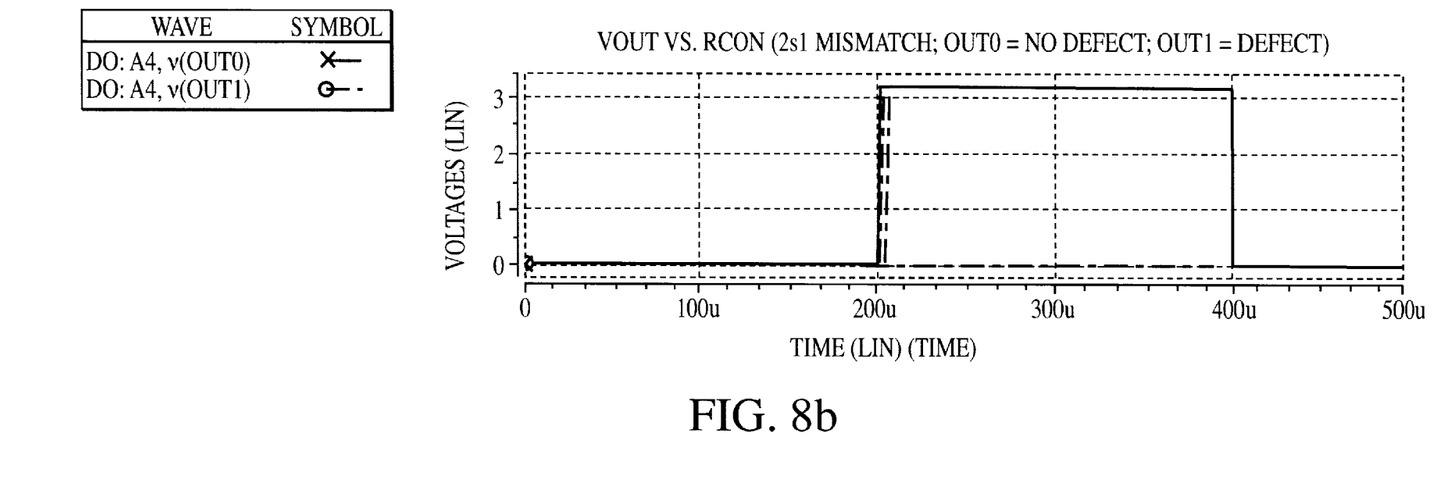
Figure 8C:
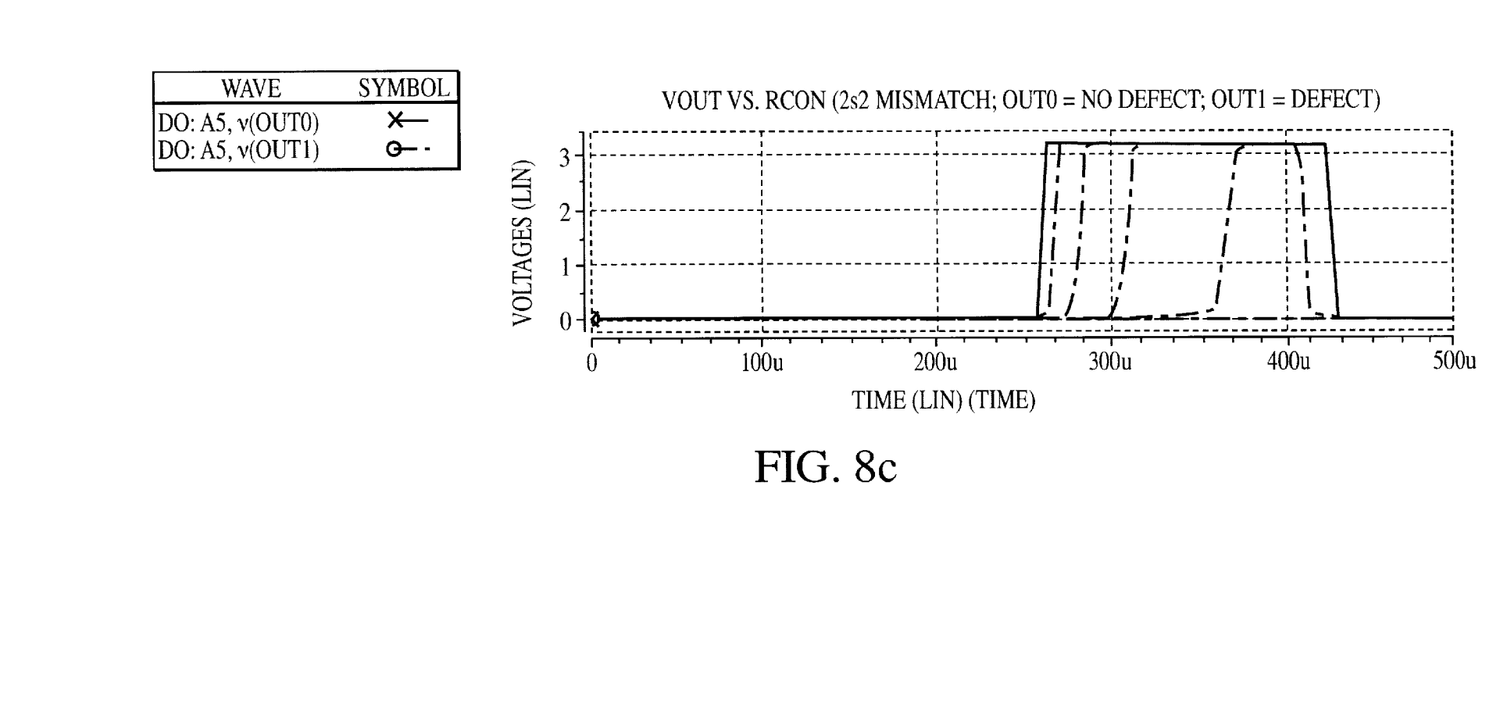

FIGS. 8a–8c show a collection of simulation results, illustrating the time behavior of the outputs of monitors M0 and M1, the latter one connected to the 'faulty' connection, as a function of the value of the connection modeling resistor $R_{CONT}$, and taking into account different mismatch situations. During the intervals 0–200 μs and 400–500 μs the switches are open, and thus the device is in non-testing mode, and during the interval 200–400 μs the switches are closed, for pulling a test current. FIG. 8a shows the reaction of these monitors for typical process parameters and when no mismatch is taken into account. FIG. 8b shows the influence of $V_T$ mismatch and FIG. 8c shows the influence of β mismatch. In all cases, detection of the 'faulty' connection (being a connection resistance>1.5Ω, being 7.5 times the normal connection resistance and determined by the comparator's switching level) is guaranteed. The typical reaction time of the monitor is 20 μs, where the worst case reaction time if 170 μs.

It is intended that the foregoing detailed description be regarded as illustrative rather than limiting and that it is understood that the following claims, including all equivalents, are intended to define the scope of the invention.

What is claimed:

1. A device for testing a supply connection of an electronic device by measuring and evaluating a test current flowing in said supply connection, said device comprising:
    at least one current mirror, the current mirror including at least a first branch and a second branch, said branches having at least one end, the one end of the first branch being connected to the supply connection at a first point, the one end of the second branch being connected to the supply connection at a second point, said first and said second points being at different locations of the supply connection to said electronic device, said current mirror being adapted for generating an output, the output being related to said test current; and
    means for drawing conclusions on said supply connection based at least in part on said output.

2. The test device as recited in claim 1, further comprising means for forcing said test current through said supply connection.

3. The test device as recited in claim 2, wherein said means for drawing conclusions on said supply connection comprises means for comparing outputs obtained when no test current is forced through said supply connection and when test current is forced through said supply connection.

4. The test device as recited in claim 3, wherein said means for forcing said test current through said supply connection comprises a switch,
    wherein when said switch is open, no test current is forced through said supply connection, and
    wherein when said switch is closed, test current is forced through said supply connection.

5. The test device as recited in claim 1, wherein said output is an output voltage and further comprising means for sampling said output voltage.

6. The test device as recited in claim 1, wherein said test device is integrated with said electronic device on one integrated circuit.

7. The test device as recited in claim 1, wherein said electronic device is a CMOS device.

8. The test device as recited in claim 1, wherein said test current flows in said electronic device.

9. The test device as recited in claim 1, wherein said current mirror is adapted in order to be in balance for a reference situation.

10. The test device as recited in claim 1, wherein said means for drawing conclusions on said supply connection comprises a memory device with a look-up table.

11. The test device as recited in claim 1, wherein said means for drawing conclusions on said supply connection comprises a comparator circuit.

12. A method for testing a supply connection of an electronic device by measuring and evaluating a test current flowing in said supply connection, said method comprising the step of:

generating an output with a current mirror, the current mirror including at least a first branch and a second branch, said branches having at least one end, the one end of the first branch being connected to the supply connection at a first point, the one end of the second branch being connected to the supply connection at a second point, said first and said second points being at different locations of the supply connection to said electronic device, said output being related to said test current; and drawing conclusions on said supply connection based, at least in part, on said output.

13. The method as recited in claim 12, wherein said test current is forced through said supply connection.

14. The method as recited in claim 13, wherein the step of drawing conclusions on said supply connection based, at least in part, on said output comprises comparing said outputs obtained when no test current is forced through said supply connection and when test current is forced through said supply connection.

15. The method as recited in claim 12, wherein said electronic device is a CMOS device.

16. The method as recited in claim 12, wherein said test current flows in said electronic device.

17. The method as recited in claim 12, wherein said step of generating an output with a current mirror includes generating an output voltage; and wherein said output voltage is related to said test current.

18. The method as recited in claim 12, wherein the step of drawing conclusions on said supply connection based, at least in part, on said output comprises comparing said output with predetermined values stored in a look-up table in a memory device.

19. The method as recited in claim 12, wherein the step of drawing conclusions on said supply connection based, at least in part, on said output comprises comparing said output with a predetermined value.

20. The method as recited in claim 19, wherein said predetermined value is stored in a look-up table in a memory device.

* * * * *